US010932363B2

(12) United States Patent
Chamberlin et al.

(10) Patent No.: US 10,932,363 B2
(45) Date of Patent: Feb. 23, 2021

(54) GLASS FIBER COATINGS FOR IMPROVED RESISTANCE TO CONDUCTIVE ANODIC FILAMENT FORMATION

(71) Applicant: International Business Machines Corporation, Armonk, NY (US)

(72) Inventors: Bruce J. Chamberlin, Vestal, NY (US); Matthew S. Kelly, Oakville (CA); Scott B. King, Rochester, MN (US); Joseph Kuczynski, North Point, FL (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/536,539

(22) Filed: Aug. 9, 2019

(65) Prior Publication Data

US 2019/0364659 A1 Nov. 28, 2019

Related U.S. Application Data

(62) Division of application No. 15/364,938, filed on Nov. 30, 2016, now Pat. No. 10,462,900.

(51) Int. Cl.
*H05K 1/03* (2006.01)
*C08J 5/24* (2006.01)
(Continued)

(52) U.S. Cl.
CPC .......... *H05K 1/0366* (2013.01); *C03C 25/34* (2013.01); *C08J 5/08* (2013.01); *C08J 5/24* (2013.01);
(Continued)

(58) Field of Classification Search
CPC ......... H05K 1/0366; H05K 2201/0769; H05K 2203/0759; C03C 25/34; C08J 5/08; C08J 5/24; C08J 2371/12; C09D 171/12
See application file for complete search history.

(56) References Cited

U.S. PATENT DOCUMENTS 2,067,220 A   1/1937   Whitehead
3,895,158 A   7/1975   Gause
(Continued)

FOREIGN PATENT DOCUMENTS

CN   200961174 Y   10/2007
CN   103911861 B    1/2016
(Continued)

OTHER PUBLICATIONS

Gardiner, "The making of glass fiber," Composites, Apr. 2009 [posted Mar. 25, 2009], CompositesWorld.com (online), 6 pgs., URL: www.compositesworld.com/articles/the-making-of-glass-fiber.
(Continued)

*Primary Examiner* — Jeffry H Aftergut
(74) *Attorney, Agent, or Firm* — Jared L. Montanaro

(57) ABSTRACT

A process of improving resistance to conductive anodic filament (CAF) formation is disclosed. The process includes dissolving a base resin material, a lubricant material, and a coupling agent in a solvent to form a functionalized sizing agent solution. The process also includes applying the functionalized sizing agent solution to individual glass fibers following a glass fiber formation process. The process further includes removing the solvent via a thermal process that partially converts the base resin material. The thermal process results in formation of coated glass fibers having a flowable resin coating that is compatible with a pre-impregnated (prepreg) matrix material utilized to form a prepreg material for manufacturing a printed circuit board. During one or more printed circuit board manufacturing operations, the flowable resin coating flows to fill voids between the individual glass fibers that represent CAF formation pathways.

5 Claims, 4 Drawing Sheets

(51) Int. Cl.
*C03C 25/34* (2006.01)
*C08J 5/08* (2006.01)
*C09D 171/12* (2006.01)

(52) U.S. Cl.
CPC ......... *C08J 2371/12* (2013.01); *C09D 171/12* (2013.01); *H05K 2201/0769* (2013.01); *H05K 2203/0759* (2013.01)

(56) References Cited

U.S. PATENT DOCUMENTS

| | | | |
|---|---|---|---|
| 4,500,660 A | 2/1985 | Minamisawa | |
| 5,104,698 A | 4/1992 | Hayashi et al. | |
| 5,168,006 A * | 12/1992 | Inoguchi | B29C 70/22 428/902 |
| 5,330,595 A | 7/1994 | Held | |
| 5,773,371 A | 6/1998 | Appelt et al. | |
| 5,919,525 A | 7/1999 | Appelt et al. | |
| 6,809,046 B2 | 10/2004 | Velpari | |
| 7,144,472 B2 | 12/2006 | Sato | |
| 7,220,453 B2 | 5/2007 | Nishimura | |
| 8,974,888 B2 | 3/2015 | Balcome | |
| 9,351,405 B2 | 5/2016 | Boday | |
| 2002/0055313 A1 * | 5/2002 | Velpari | C03C 25/10 442/180 |
| 2002/0058140 A1 * | 5/2002 | Dana | H05K 1/036 428/375 |
| 2004/0180202 A1 | 9/2004 | Lawton | |
| 2013/0061401 A1 | 3/2013 | Boday et al. | |
| 2013/0280417 A1 | 10/2013 | Boday et al. | |
| 2015/0060115 A1 | 3/2015 | Lee et al. | |
| 2016/0368821 A1 | 12/2016 | Czaplewski et al. | |
| 2018/0153042 A1 | 5/2018 | Chamberlin et al. | |
| 2018/0273426 A1 | 9/2018 | Chamberlin et al. | |

FOREIGN PATENT DOCUMENTS

| | | |
|---|---|---|
| CN | 105555021 A1 | 5/2016 |
| WO | 0168752 A1 | 9/2001 |
| WO | 0224592 A1 | 3/2002 |
| WO | 2010097261 A1 | 9/2010 |
| WO | 2011107418 A1 | 9/2011 |
| WO | 2015059162 A1 | 4/2015 |

OTHER PUBLICATIONS

List of IBM Patents or Applications Treated as Related, Aug. 6, 2019, 2 pgs.

Morgan, A., "Developments in Glass Yarns and Fabric Constructions," The PCB Magazine, Mar. 2014, 9 pgs.

Wallenberger, et al., "Glass Fibers," ASM Handbook, vol. 21: Composites, Constituent Materials Chapter, Dec. 2001, pp. 27-34, ASM International, Materials Park, OH, USA.

Wikipedia, "Surface tension of various liquids in dyn/cm against air," Data Table, from, "Surface Tension," Wikipedia.org (online), [accessed Nov. 29, 2016], 1 pg., URL: en.wikipedia.org/wiki/Surface_tension.

* cited by examiner

GLASS FIBER COATINGS FOR IMPROVED RESISTANCE TO CONDUCTIVE ANODIC FILAMENT FORMATION

BACKGROUND

In locations on printed circuit boards where there are sources of copper, an electrical bias, glass fiber, and moisture, there is the potential for conductive anodic filament (CAF) formation. One particular area of concern is a void located in a region in woven glass where adjacent fibers touch (also referred to as a "triple point"). During fabrication of a printed circuit board, resin may fail to penetrate the triple point, thereby creating the void that provides a potential path for CAF growth. Typically, conductive anodic filaments form at an interface where the glass fiber has delaminated from the resin or where a triple point extends into a plated through hole (PTH). This may create a path for water diffusion and subsequent copper precipitation, leading to CAF formation and potential catastrophic failure of the printed circuit board.

SUMMARY

According to an embodiment, a process of improving resistance to conductive anodic filament (CAF) formation is disclosed. The process includes dissolving a base resin material, a lubricant material, and a coupling agent in a solvent to form a functionalized sizing agent solution. The process also includes applying the functionalized sizing agent solution to individual glass fibers following a glass fiber formation process. The process further includes removing the solvent via a thermal process that partially converts the base resin material. The thermal process results in formation of coated glass fibers having a flowable resin coating that is compatible with a pre-impregnated (prepreg) matrix material utilized to form a prepreg material for manufacturing a printed circuit board. During one or more printed circuit board manufacturing operations, the flowable resin coating flows to fill voids between the individual glass fibers that represent CAF formation pathways.

According to another embodiment, a prepreg material is disclosed. The prepreg material is formed by a process that includes dissolving a base resin material, a lubricant material, and a coupling agent in a solvent to form a functionalized sizing agent solution. The process includes applying the functionalized sizing agent solution to individual glass fibers following a glass fiber formation process. The process also includes removing the solvent via a thermal process that partially converts the base resin material. The thermal process results in formation of coated glass fibers having a flowable resin coating that is compatible with a polyphenylene oxide (PPO)-based prepreg matrix material. The process further includes weaving the coated glass fibers to form a woven glass cloth having the flowable resin coating and utilizing the PPO-based prepreg matrix material and the woven glass cloth having the flowable resin coating to form a prepreg material. During one or more printed circuit board manufacturing operations, the flowable resin coating flows to fill voids between the individual glass fibers that represent CAF formation pathways According to yet another embodiment, a printed circuit board is disclosed. The printed circuit board is formed by a process that includes dissolving a base resin material, a lubricant material, and a coupling agent in a solvent to form a functionalized sizing agent solution. The process includes applying the functionalized sizing agent solution to individual glass fibers following a glass fiber formation process. The process also includes removing the solvent via a thermal process that partially converts the base resin material. The thermal process results in formation of coated glass fibers having a flowable resin coating that is compatible with a pre-impregnated (prepreg) matrix material. The process further includes weaving the coated glass fibers to form a woven glass cloth having the flowable resin coating, forming a prepreg material utilizing the prepreg matrix material and woven glass cloth having the flowable resin coating, and utilizing the prepreg material to form a printed circuit board. The flowable resin coating flows to fill voids between the individual glass fibers that represent CAF formation pathways.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

The present disclosure describes processes and materials that provide improved resistance to CAF formation in printed circuit boards. During the fabrication of glass filaments, a sizing agent is typically applied as the individual glass filaments are drawn through a bobbin as the filaments exit a furnace. The purpose of the sizing agent is to prevent the glass fibers from fracturing during subsequent winding operations by imparting additional mechanical strength. The sizing agent also serves to lubricate the glass to facilitate movement of the filaments. In the present disclosure, a conventional sizing agent is replaced with a functionalized coating (also referred to herein as a "functionalized sizing agent") that serves as the sizing agent, coupling agent, and coating. The functionalized coating of the present disclosure is applied to individual glass fibers after the glass fiber forming process. During subsequent printed circuit board manufacturing, the functionalized coating flows during lamination to fill the regions between adjacent glass fibers, thereby eliminating the voids associated with conventional printed circuit board fabrication processes that represent potential paths for CAF formation.

Figure 1:
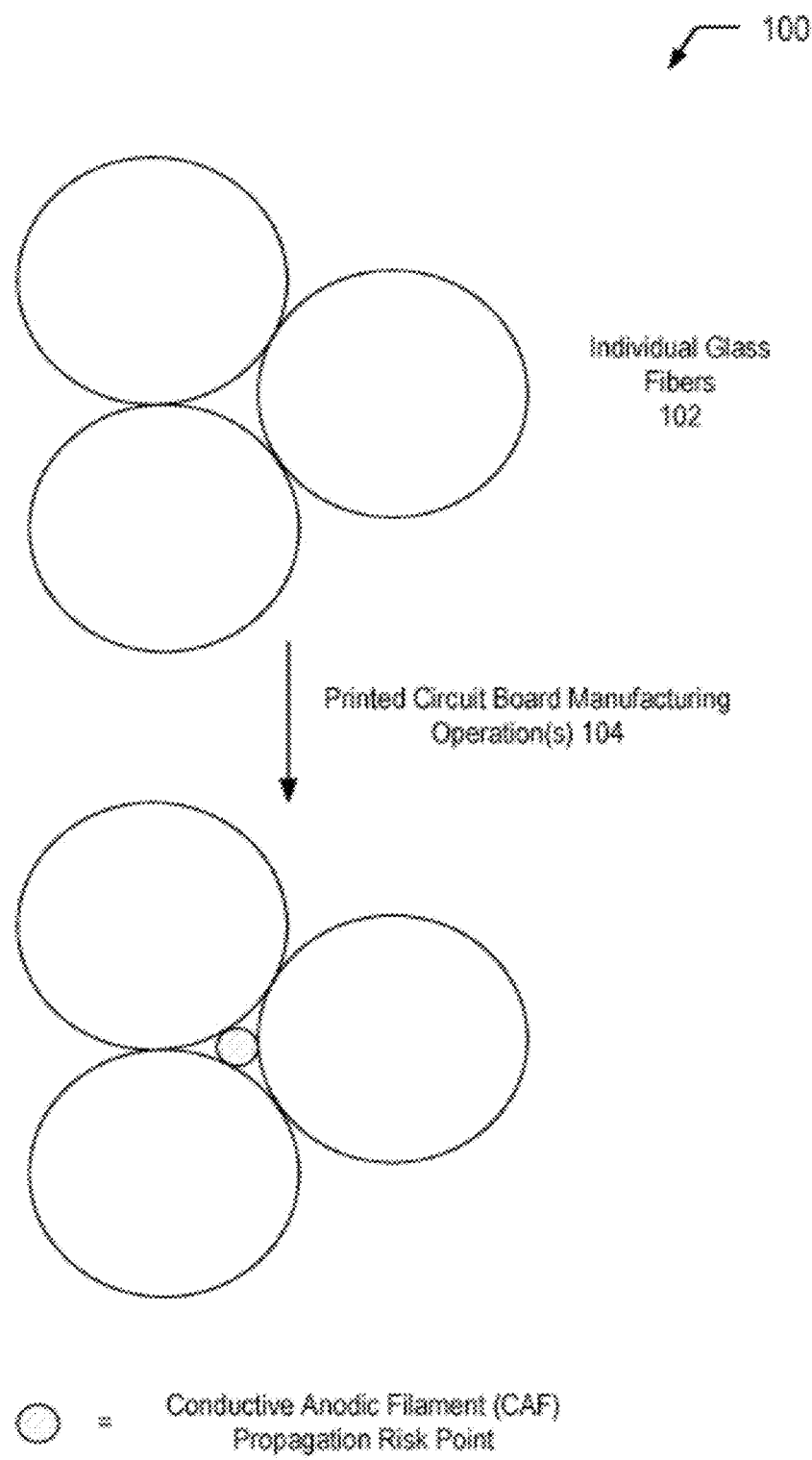
FIG. 1 is a prior art diagram depicting a void in a region between adjacent glass fibers that represents a CAF propagation risk point, according to one embodiment.

FIG. 1 is a prior art diagram 100 depicting a conventional process of printed circuit board fabrication. In FIG. 1, individual glass fibers 102 are utilized to form a printed circuit board via one or more printed circuit board manufacturing operations 104. In the conventional process depicted in FIG. 1, resin is added after fibers, bundles, yarns, and cloths are formed, making resin penetration into small spaces difficult. As previously described herein, remaining voids have been shown to be starting points for subsequent CAF formation. FIG. 1 illustrates that, during fabrication of the printed circuit board, resin fails to penetrate the triple point thereby creating a void that provides a path for CAF growth (identified as a "CAF propagation risk point" in FIG. 1).

Figure 2:
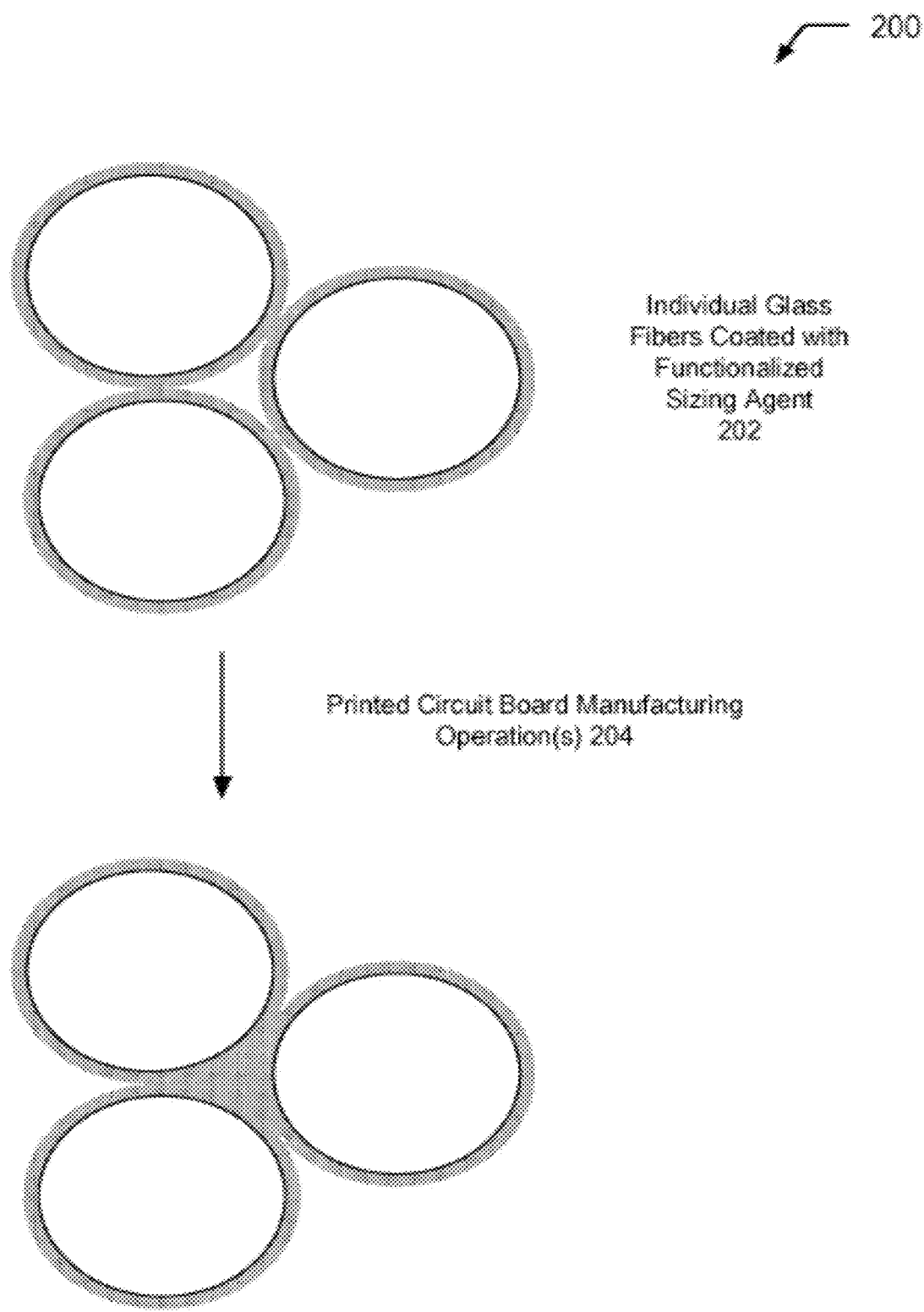
FIG. 2 is a diagram depicting a particular embodiment of a process of utilizing individual glass fibers coated with a functionalized sizing agent that flows into the region between the individual glass fibers during a printed circuit board lamination process for improved resistance to CAF formation.

Referring to FIG. 2, a diagram 200 illustrates an example of a process of utilizing individual glass fibers having a resin-compatible coating that flows into the region between the individual glass fibers during printed circuit board manufacturing operation(s) 204 for improved resistance to CAF formation. In FIG. 2, a functionalized sizing agent is applied to each individual glass fiber using a coating method (e.g., using the sizing agent application component(s) 324 depicted in FIG. 3). As described further herein, when the individually coated glass fibers are subsequently bundled into a woven glass cloth, resin is located within small spaces between fibers and bundles in order to reduce or eliminate starting points for CAF formation. In contrast to FIG. 1, FIG. 2 illustrates the elimination of the CAF propagation risk point that is associated with the lack of penetration of resin into the small spaces between the glass fibers.

Figure 3:
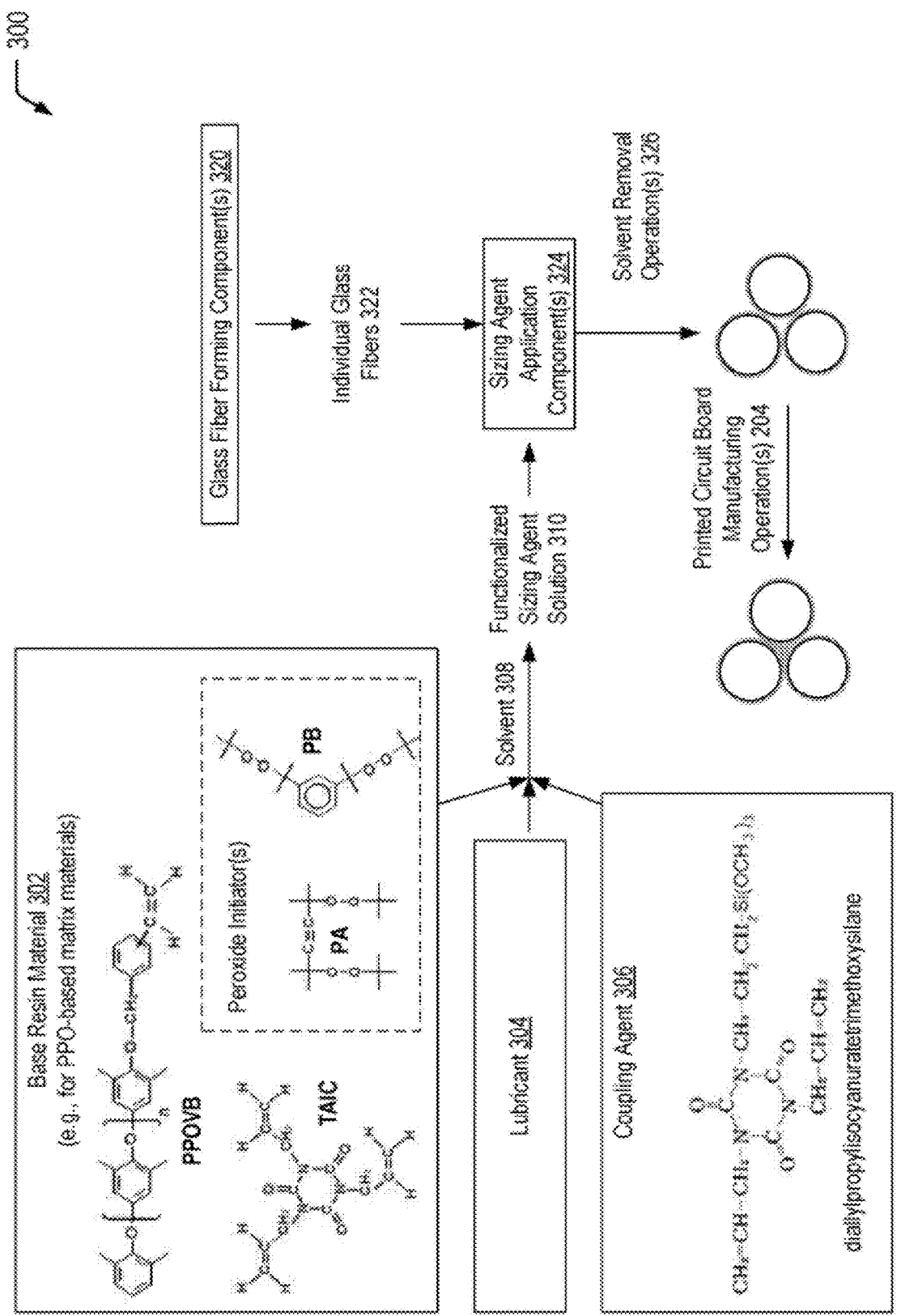
FIG. 3 is a diagram depicting an example of a process of forming the individual glass fibers coated with the functionalized sizing agent depicted in FIG. 2.

Referring to FIG. 3, a diagram 300 depicts an example of a process of forming the individual glass fibers coated with the functionalized sizing agent 202 depicted in FIG. 2. FIG. 3 illustrates that a base resin material 302, a lubricant 304, and a coupling agent 306 may be dissolved in a solvent 308 to form a functionalized sizing agent solution 310. The functionalized sizing agent 310 may be applied after individual glass fibers 322 exit a furnace.

FIG. 3 depicts an example of components of a functionalized sizing agent for E-glass filaments for use with one or more prepreg materials. In a particular embodiment, the prepreg material may be a poly(p-phenylene oxide)-based matrix material (also referred to as a "PPO-based matrix material"). FIG. 3 illustrates a particular embodiment in which, for PPO-based matrix materials, the base resin material 302 may include poly(2,6-dimethylphenylene oxide) with vinylbenzyl end groups (identified as "PPOVB" in FIG. 3). In the case of PPO-based matrix materials, FIG. 3 illustrates an example in which the base resin material 302 also includes triallylisocyanurate (identified as "TAIC" in FIG. 3) that may be selected for compatibility with the particular PPO-based material. Alternatively, as PPO-based materials have terminal vinyl groups for cross-linking (e.g., terminal vinyl benzene groups in the example of FIG. 3), alternatives to TAIC may include a methacrylate-based resin or an acrylate-based resin that would cross-link with the unsaturated resin.

The base resin material 302 also includes one or more peroxide initiators. As an example, the peroxide initiator(s) may include 2,5-di-(t-butylperoxy)-2,5-dimethyl-3-hexyne (identified as "PA" in FIG. 3). As another example, the peroxide initiator(s) may include alpha, alpha'-Bis(t-butylperoxy)diisopropylbenzene (identified as "PB" in FIG. 3). In some cases, the peroxide initiator(s) may include a combination of PA and PB. As a prophetic example, the components of the base resin material 302 may be present in the following ratio: 73.3 weight percent PPOVB; 25.3 weight percent TAIC; 0.5 weight percent PA; and 0.9 weight percent PB.

The lubricant 304 may include amine salts of fatty acids, such as those described in PCT Publication No. WO/2015/059162. The coupling agent 306 may be selected for compatibility with the particular matrix material (e.g., a PPO-based matrix material, in the example of FIG. 3). In a particular embodiment, the coupling agent 306 may include a silane coupling agent, such as those described in PCT Publication No. WO/2010/097261. In the illustrative, non-limiting example depicted in FIG. 3, the coupling agent 306 includes diallylpropylisocyanuratetrimethoxysilane.

FIG. 3 illustrates that the base resin material 302, the lubricant 304, and the coupling agent 306 may be dissolved in a suitable solvent 308 (e.g., acetone, among other alternatives), and the resulting functionalized sizing agent solution 310 may be applied directly to individual glass fibers 322 immediately after formation of the individual glass fibers 322 using one or more glass fiber forming components 320. After application of the functionalized sizing agent solution 310 to the individual glass fibers 322 using one or more sizing agent application component(s) 324, FIG. 3 illustrates that a solvent removal operation 326 may be performed that includes a thermal process to remove residual solvent. The thermal process may be tailored to partially convert the base resin, with the resulting fibers having B-staged resin coupled to the fiber surface.

By applying a sufficient amount of the functionalized sizing agent solution 310 onto each of the individual glass fibers 322, when the coated glass fibers 202 are wrapped into a yarn, there may be enough material present to fill the void between adjacent fibers during the B-stage process. Furthermore, if the void is not entirely filled during the B-stage process, cross-linking is not completed during the B-stage process. As such, when the B-staged material is combined with other cores in a PCB lamination process, the modified resin-compatible coating on the yarn may flow and cross-link to eliminate potential CAF formation pathway(s).

Thus, FIG. 3 illustrates an example of a process of forming individual glass fibers that are coated with a functionalized sizing agent. As described further herein, during the B-stage process and/or subsequent PCB lamination operations, this coating may flow to fill the spaces between the individual glass fibers. Filling the spaces between the individual glass fibers eliminates the CAF propagation risk points that result from the prior art process described with respect to FIG. 1, in which resin fails to flow into the small spaces between the glass fibers.

Figure 4:
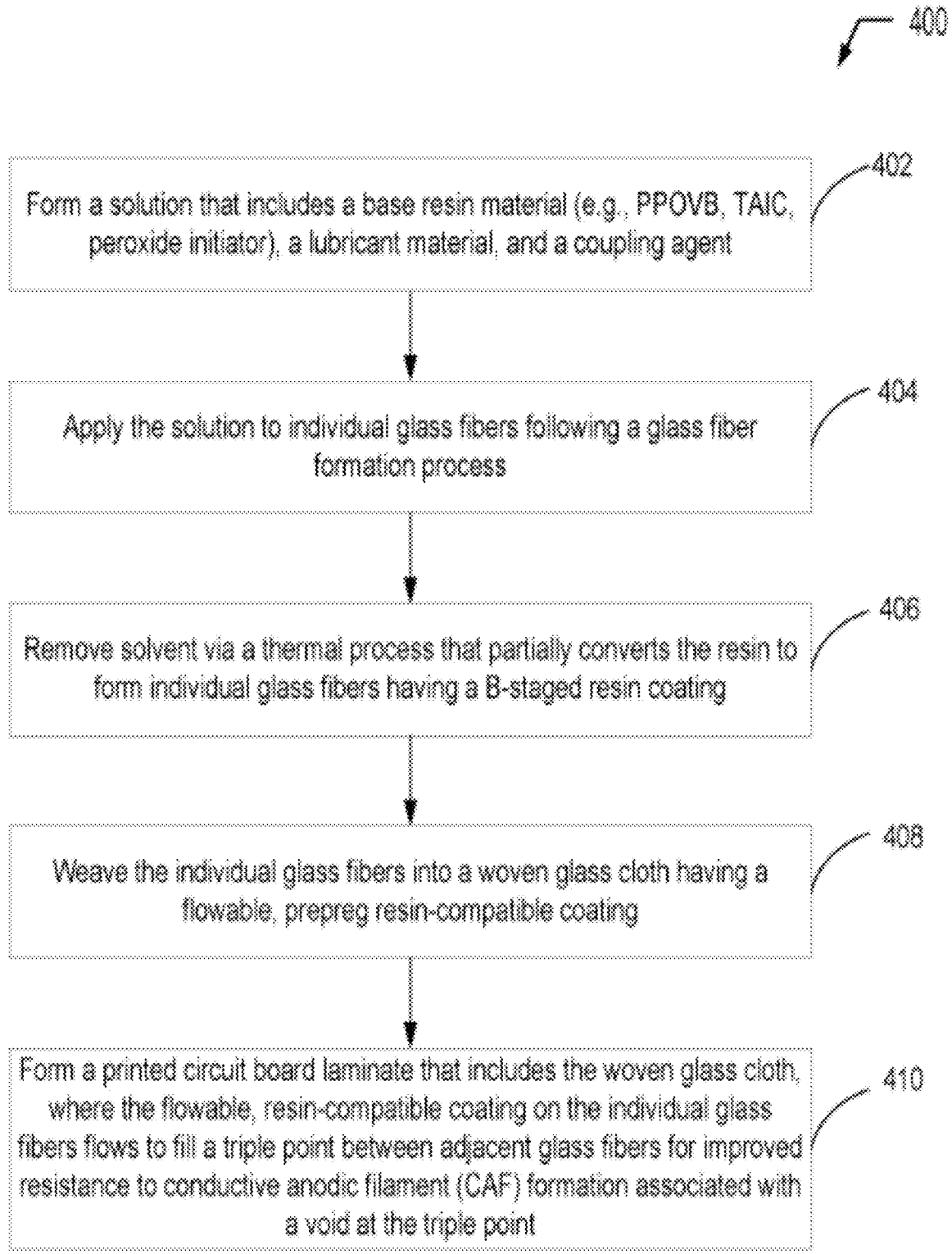
FIG. 4 is a flow diagram showing a particular embodiment of a process of utilizing glass fibers coated with a functionalized sizing agent for improved resistance to conductive anodic filament formation.

Referring to FIG. 4, a flow diagram depicts an example of a process 400 of utilizing glass fibers coated with a functionalized sizing agent for improved resistance to conductive anodic filament formation. In the particular embodiment illustrated in FIG. 4, operations associated with an example process of forming individual glass fibers coated with a functionalized sizing agent and weaving the fibers into a woven glass cloth are identified as operations 402-408, while operations associated with forming a printed circuit board laminate using the woven glass cloth are identified as operation 410. It will be appreciated that the operations shown in FIG. 4 are for illustrative purposes only and that the operations may be performed in alternative orders, at alternative times, by a single entity or by multiple entities, or a combination thereof. As an example, one entity may form the woven glass cloth having the flowable, resin-compatible coating, another entity may form a prepreg material that includes the woven glass cloth, while another entity may utilize the prepreg material to form a printed circuit board laminate.

The process 400 includes forming a solution that includes a base resin material, a lubricant material, and a coupling agent, at 402. For example, referring to FIG. 3, the base resin material 302, the lubricant 304, and the coupling agent 306 may be dissolved in the solvent 308 to form the functionalized sizing agent solution 310. In the example of FIG. 3, the components of the functionalized sizing agent solution 310 are selected for E-glass filaments for use with a PPO-based matrix material. It will be appreciated that alternative components may be selected in cases of different types of glass filaments and/or different types of matrix materials.

The process 400 includes applying the solution to individual glass fibers following a glass fiber formation process, at 404. For example, referring to FIG. 3, after the individual glass fibers 322 have been formed using the glass fiber forming component(s) 320 (e.g., after the fibers 322 exit a furnace), the functionalized sizing agent solution 310 may be applied to the individual glass fibers 322 using the sizing agent application component(s) 324.

The process 400 includes removing solvent via a thermal process that partially converts the resin to form individual glass fibers having a B-staged resin coating, at 406. For example, referring to FIG. 3, after application of the functionalized sizing agent solution 310 to the individual glass fibers 322, the solvent removal operation(s) 326 may be performed to remove the residual solvent 308. Removal of the residual solvent 308 results in the individual glass fibers coated with the functionalized sizing agent 202 depicted in FIGS. 2 and 3.

In the particular embodiment depicted in FIG. 4, the process 400 further includes weaving the individual glass fibers into a woven glass cloth having a flowable, resin-compatible coating, at 408. For example, while not shown in FIG. 3, after the solvent removal operation(s) 326, the individual glass fibers coated with the functionalized sizing agent 202 may be woven into a woven glass cloth having a flowable, resin-compatible coating.

In the particular embodiment depicted in FIG. 4, the process 400 further includes forming a printed circuit board laminate that includes the woven glass cloth (having the flowable, resin-compatible coating), at 410. During the lamination process, the flowable, resin-compatible coating on the individual glass fibers flows to fill a triple point between adjacent glass fibers. As described further herein with respect to the prior art process depicted in FIG. 1, a void at the triple point represents a CAF propagation risk point. In contrast to the prior art process depicted in FIG. 1, FIG. 2 illustrates that the flowable, resin-compatible coating on the individual glass fibers flows into the triple point during the lamination process to eliminate the void at the triple point. As described further herein, eliminating the void that represents a CAF propagation risk point provides improved resistance to CAF formation in a printed circuit board.

Thus, FIG. 4 illustrates an example of a process of utilizing glass fibers coated with a functionalized sizing agent for improved resistance to conductive anodic filament formation. The improved resistance to CAF formation results from the elimination of voids between the adjacent glass fibers that represent CAF propagation risk points.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A pre-impregnated (prepreg) material formed by a process comprising:
dissolving a base resin material, a lubricant material, and a coupling agent in a solvent to form a functionalized sizing agent solution, wherein the base resin material includes include poly(2,6-dimethylphenylene oxide) with vinyl benzyl end groups (PPOVB), triallylisocyanurate (TAIC), and one or more peroxide initiators, wherein the lubricant material includes one or more amine salts of fatty acids, and wherein the coupling agent includes a silane coupling agent;
applying the functionalized sizing agent solution to individual glass fibers following a glass fiber formation process;
removing the solvent via a thermal process that partially converts the base resin material, resulting in formation of coated glass fibers having a flowable resin coating that is compatible with a polyphenylene oxide (PPO)-based pre-impregnated (prepreg) matrix material;
weaving the coated glass fibers to form a woven glass cloth having the flowable resin coating; and
utilizing the PPO-based prepreg matrix material and the woven glass cloth having the flowable resin coating to form a prepreg material,
wherein, during one or more printed circuit board manufacturing operations, the flowable resin coating flows to fill voids between the individual glass fibers that represent conductive anodic filament (CAF) formation pathways.

2. The prepreg material of claim 1, wherein the flowable resin coating at least partially fills voids between the individual glass fibers during formation of the prepreg material.

3. A printed circuit board formed by a process comprising:
dissolving a base resin material, a lubricant material, and a coupling agent in a solvent to form a functionalized sizing agent solution, wherein the base resin material includes include poly(2,6-dimethylphenylene oxide) with vinyl benzyl end groups (PPOVB), triallylisocyanurate (TAIC), and one or more peroxide initiators, wherein the lubricant material includes one or more amine salts of fatty acids, and wherein the coupling agent includes a silane coupling agent;
applying the functionalized sizing agent solution to individual glass fibers following a glass fiber formation process;
removing the solvent via a thermal process that partially converts the base resin material, resulting in formation of coated glass fibers having a flowable resin coating that is compatible with a pre-impregnated (prepreg) matrix material;
weaving the coated glass fibers to form a woven glass cloth having the flowable resin coating;
forming a prepreg material utilizing the prepreg matrix material and the woven glass cloth having the flowable resin coating, wherein the prepreg matrix material includes a polyphenylene oxide (PPO)-based matrix material; and
utilizing the prepreg material to form a printed circuit board, wherein the flowable resin coating flows to fill voids between the individual glass fibers that represent conductive anodic filament (CAF) formation pathways.

4. The printed circuit board of claim 3, wherein the flowable resin coating at least partially fills voids between the individual glass fibers during formation of the prepreg material.

5. The printed circuit board of claim 3, wherein the printed circuit board includes a printed circuit board laminate, and wherein the flowable resin coating fills voids between the individual glass fibers during one or more printed circuit board lamination operations.

\* \* \* \* \*